US011799569B2

(12) United States Patent
Johnston et al.

(10) Patent No.: US 11,799,569 B2
(45) Date of Patent: Oct. 24, 2023

(54) PATHLOSS MITIGATION VIA SIMULATED MODELS OF DYNAMIC ENVIRONMENTS

(71) Applicant: THE BOEING COMPANY, Chicago, IL (US)

(72) Inventors: Matthew Johnston, Mountain View, CA (US); Seth Jahne, Anaheim, CA (US); Adam Lee Griswold, Garden Grove, CA (US)

(73) Assignee: THE BOEING COMPANY, Arlington, VA (US)

( * ) Notice: Subject to any disclaimer, the term of this patent is extended or adjusted under 35 U.S.C. 154(b) by 0 days.

(21) Appl. No.: 16/212,340

(22) Filed: Dec. 6, 2018

(65) Prior Publication Data

US 2020/0186268 A1 Jun. 11, 2020

(51) Int. Cl.
*H04W 16/22* (2009.01)
*H04B 17/391* (2015.01)
(Continued)

(52) U.S. Cl.
CPC ......... *H04B 17/3912* (2015.01); *H04L 41/22* (2013.01); *H04W 16/18* (2013.01);
(Continued)

(58) Field of Classification Search
CPC ....... H04L 41/14; H04L 43/00; G06F 30/367; G06F 11/261; G06G 3/10; G06G 7/40;
(Continued)

(56) References Cited

U.S. PATENT DOCUMENTS 8,352,223 B1 1/2013 Anthony et al.
2004/0236547 A1* 11/2004 Rappaport ........... G06Q 10/087
703/2

(Continued)

FOREIGN PATENT DOCUMENTS

CN 205318661 U 6/2016
JP 08129655 A * 5/1996
(Continued)

OTHER PUBLICATIONS

English translation for JP08129655A (Year: 2020).*
(Continued)

*Primary Examiner* — Salvador E Rivas
(74) *Attorney, Agent, or Firm* — Patterson + Sheridan, LLP

(57) ABSTRACT

Aspects provide for dynamic pathloss mitigation via a cross layer tool chain by simulating a three-dimensional model of a physical environment including an access point, an endpoint running an application, and a passive object; emulating network traffic for the application transmitted between the access point and the endpoint; simulating, in the model, pathways for signals to carry the traffic in a plurality of regions for the physical environment; emulating signal degradation along the pathways in the plurality of regions based on respective locations for the access point, the endpoint, and the passive object in the physical environment; and in response to the signal degradation satisfying a pathloss threshold, outputting a command to the application to affect operations of the endpoint. Additionally, the cross layer tool chain outputs a Graphical User Interface showing a signal degradation map based on the simulated network traffic overlaid on the model.

20 Claims, 5 Drawing Sheets

(51) Int. Cl.
*H04L 41/22* (2022.01)
*H04W 16/18* (2009.01)
*H04W 24/02* (2009.01)
*H04W 24/06* (2009.01)
*G06F 11/26* (2006.01)
*G01R 31/3183* (2006.01)
*G01R 31/28* (2006.01)

(52) U.S. Cl.
CPC ........... *H04W 16/22* (2013.01); *H04W 24/02* (2013.01); *H04W 24/06* (2013.01); *G01R 31/2848* (2013.01); *G01R 31/3183* (2013.01); *G05B 2219/23447* (2013.01); *G06F 11/261* (2013.01)

(58) Field of Classification Search
CPC ..... H04W 16/18; H04W 24/06; H04W 16/22; H04B 17/3912; H04B 7/18556; G05B 2219/23447; H04N 21/442; H04N 21/251; G01R 31/2848; G01R 31/3183
See application file for complete search history.

(56) References Cited

U.S. PATENT DOCUMENTS

| | | | |
|---|---|---|---|
| 2015/0323675 A1* | 11/2015 | Munoz | G01S 19/51 342/357.42 |
| 2017/0052250 A1* | 2/2017 | Jeong | A61B 8/5269 |
| 2017/0235853 A1 | 8/2017 | Griswold et al. | |
| 2018/0220453 A1 | 8/2018 | Johnston et al. | |

FOREIGN PATENT DOCUMENTS

| | | |
|---|---|---|
| JP | H11509074 A | 8/1999 |
| JP | 2007525040 A | 8/2007 |
| JP | 200822388 A | 1/2008 |
| JP | 2010147519 A | 7/2010 |
| JP | 201576893 A | 4/2015 |
| WO | 2004066077 A2 | 8/2004 |

OTHER PUBLICATIONS

R. Bukowski and C. Séquin, "Object associations: A simple and practical approach to virtual 3D manipulation", Apr. 1995, Computer Graphics (1995 Symposium on Interactive 3D Graphics), pp. 131-138 and 214. (Year: 1995).*

Extended European Search Report for Application No. 19199036.5-1231 dated Apr. 23, 2020.

Canadian Patent Office, Office Action for Canadian Patent Application No. 3,056,046, dated Nov. 21, 2022.

Japanese Patent Office, Notice of Reasons for Rejection for Application 2019-161945 dated Jul. 31, 2023.

* cited by examiner

PATHLOSS MITIGATION VIA SIMULATED MODELS OF DYNAMIC ENVIRONMENTS

FIELD

Aspects of the present disclosure provide a cross-layer tool chain for wireless network design, analysis, and optimization.

BACKGROUND

The present disclosure relates to environmental modeling and management, and more specifically, to modeling signaling characteristics in a dynamic environment to manage networked devices. A dynamic environment, as opposed to a static environment, is an environment in which the locations of various objects in the environment change. As objects move about to different locations and orientations in the environment, the objects may block/attenuate signals, reflect signals, and provide interference in different ways than from the prior locations and orientations of those objects. These mobile objects affect the quality of signals used to communicate between various networked devices in the environment, which can impart reduced functionality in the affected devices (e.g., lost signals, data transfer errors, high latency) and impart permanent design constraints based on transient pathloss issues (e.g., excessive build-out, conservative device placement).

SUMMARY

The present disclosure provides a method in one aspect, the method including: simulating a three-dimensional model of a physical environment including an access point, an endpoint running an application, and a passive object; emulating network traffic for the application transmitted between the access point and the endpoint; simulating, in the model, pathways for signals to carry the traffic in a plurality of regions for the physical environment; emulating signal degradation along the pathways in the plurality of regions based on a first location for the access point, a second location for the endpoint, and a third location for the passive object in the physical environment; and in response to the signal degradation satisfying a pathloss threshold, outputting a command to the application to affect operations of the endpoint.

In one aspect, in combination with any example method above or below, the command includes one of: a navigational command to the endpoint navigating the physical environment, the navigational command specifying a route to follow when moving the endpoint from the second location to a fourth location that avoids a given region that satisfies the pathloss threshold; an application instruction, specifying a level of service that the application provides to the endpoint based on available signals to the endpoint at the second location; and a system setting, specifying a fifth position to move the End Point to maintain a connection with the access point;

In one aspect, in combination with any example method above or below, emulating the signal degradation further comprises: probabilistically dropping at least a portion of the traffic based on the pathway; and determining a level of service that the application provides to the endpoint based on a remaining portion of the traffic.

In one aspect, in combination with any example method above or below, a second access point is simulated in the model and emulating the signal degradation further comprises: probabilistically dropping at least a portion of the traffic based on the pathway; and in response to determining that the endpoint is attempting to disconnect from the access point and connect to the second access point based on the portion of the traffic being dropped, determining whether the second access point has available connection slots.

In one aspect, in combination with any example method above or below, simulating the three-dimensional model of the physical environment further includes simulating an active interference source that affects the signal degradation.

In one aspect, in combination with any example method above or below, emulating traffic for the application transmitted between the access point and the endpoint further comprises: running an instance of the application in the model; generating simulated inputs to the application based on historic operational inputs; and parsing outputs based on the simulated inputs to identify the traffic generated by the instance of the application.

In one aspect, in combination with any example method above or below, the method further comprises: displaying, in a Graphical User Interface, the three-dimensional model with a signal degradation mask.

In one aspect, in combination with any example method above or below, the signal degradation mask is a heatmap illustrating at least one of: an average expected latency between the access point and the endpoint across the physical environment; an average expected packet loss percentage between the access point and the endpoint at various locations across the physical environment; an average expected signal to noise ratio across the physical environment; and an average dropped connection rate between the access point and the endpoint across the physical environment in a time window.

In one aspect, in combination with any example method above or below, the signal degradation mask is a heatmap illustrating at least one of: a worst-case expected latency between the access point and the endpoint across the physical environment; a worst-case expected packet loss percentage between the access point and the endpoint across the physical environment; a worst-case expected signal to noise ratio across the physical environment; and a worst-case dropped connection rate between the access point and the End Point across the physical environment in a time window.

In one aspect, in combination with any example method above or below, the signal degradation mask indicates a fourth location to reposition the access point at to thereby reduce, compared to the first location, at least one of: a latency between the access point and the endpoint; a packet loss percentage between the access point and the endpoint; a signal to noise ratio within a first range from the access point; a signal to noise ratio within a second range from the endpoint; and a dropped connection rate between the access point and the endpoint in a time window.

The present disclosure provides a system in one aspect, the system including a processor; and a memory, including instructions that, when performed by the processor, enable the processor to perform an operation, the operation comprising: simulating a three-dimensional model of a physical environment including an access point, an endpoint running an application, and a passive object; emulating network traffic for the application transmitted between the access point and the endpoint; simulating, in the model, pathways for signals to carry the traffic in a plurality of regions for the physical environment; emulating signal degradation along the pathways in the plurality of regions based on a first location for the access point, a second location for the endpoint, and a third location for the passive object in the physical environment; and in response to the signal degradation satisfying a pathloss threshold, outputting a command to the application to affect operations of the End Point.

In one aspect, in combination with any example system above or below, the command includes one of: a navigational command to the endpoint navigating the physical environment, the navigational command specifying a route to follow when moving the End Point from the second location to a fourth location that avoids a given region that satisfies the pathloss threshold; an application instruction, specifying a level of service that the application provides to the endpoint based on available signals to the endpoint at the second location; and a system setting, specifying fifth position to move the endpoint to maintain a connection with the access point.

In one aspect, in combination with any example system above or below, emulating the signal degradation further comprises: probabilistically dropping at least a portion of the traffic based on the pathway; and determining a level of service that the application provides to the endpoint based on a remaining portion of the traffic.

In one aspect, in combination with any example system above or below emulating traffic for the application transmitted between the access point and the endpoint further comprises: running an instance of the application in the model; generating simulated inputs to the application based on historic operational inputs; and parsing outputs based on the simulated inputs to identify the traffic generated by the instance of the application.

In one aspect, in combination with any example system above or below, the operation further comprising: displaying, in a Graphical User Interface, the three-dimensional model with a signal degradation mask.

In one aspect, in combination with any example system above or below, the signal degradation mask is a topographical map illustrating several regions defined by ranges for signaling characteristics including at least one of: a latency between the access point and the endpoint; a packet loss percentage between the access point and the endpoint; a signal to noise ratio; and a dropped connection rate between the access point and the endpoint;

The present disclosure provides a system in one aspect, the system including a processor; and a memory, including instructions that, when performed by the processor, provide a cross layer tool chain including: an environment modeler, configured to produce a three-dimensional model of a dynamic environment including: a signal pathway between an access point device and an endpoint device; a network simulator, configured to: run an instance of an application running on the endpoint device; emulate network traffic generated by the application; degrade the network traffic based on the signal pathway; and monitor performance of the application based on the network traffic as degraded.

In one aspect, in combination with any example system above or below, the environment modeler outputs, in a Graphical User Interface, the three-dimensional model and a signal degradation map overlaid on the three-dimensional model based on the network traffic simulated by the network simulator.

In one aspect, in combination with any example system above or below, the network simulator outputs, in response to identifying that performance of the application falls below a pathloss threshold, an operational command to the endpoint.

In one aspect, in combination with any example system above or below, the operational command includes: a navigational command to the endpoint navigating the dynamic environment, the navigational command specifying a route to follow when moving the endpoint that avoids a given region that satisfies the pathloss threshold; an application instruction, specifying a level of service that the application provides to the endpoint based on available signals to the endpoint at a current location; and a system setting, specifying new position to move the endpoint to that maintains a connection with the access point.

BRIEF DESCRIPTION OF THE DRAWINGS

So that the manner in which the above recited features of the present disclosure can be understood in detail, a more particular description of the disclosure, briefly summarized above, may be had by reference to aspects, some of which are illustrated in the appended drawings.

DETAILED DESCRIPTION

Figure 1A:
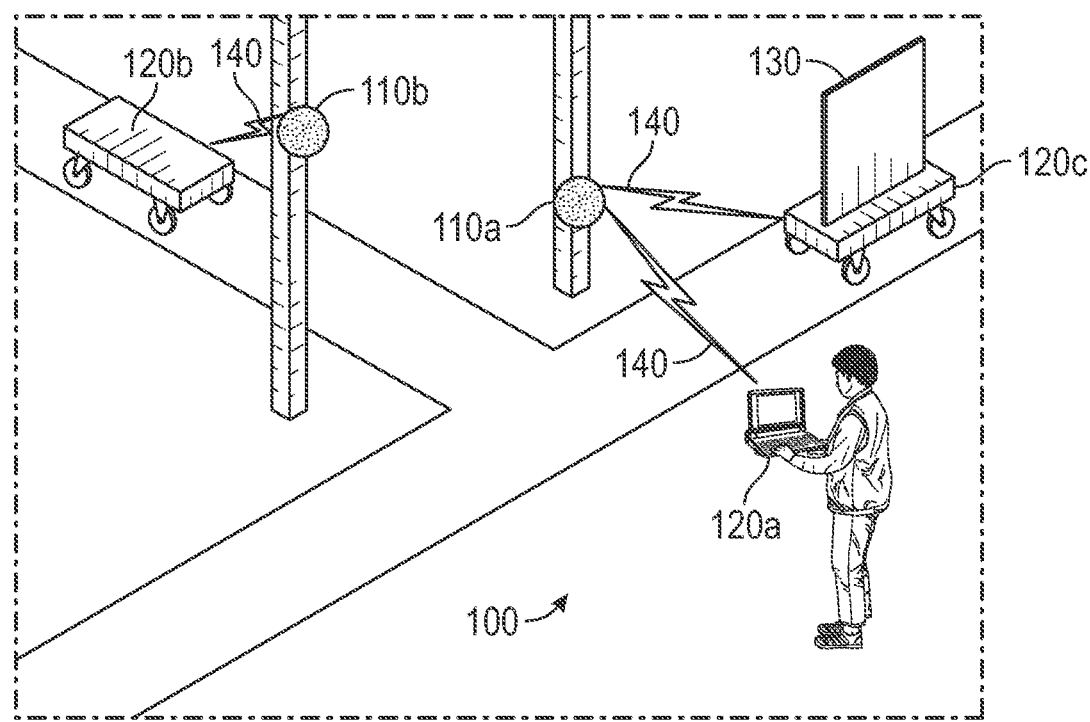
FIGS. 1A-1D illustrate various views of a dynamic environment, according to aspects of the present disclosure.

Aspects for managing wireless networks in dynamic environments are provided herein. The wireless network includes several access points (APs) that provide wireless connectivity to various endpoints (EPs) running various applications, which are distributed throughout the environment along with other objects. As the EPs and other objects move within the environment, the signal characteristics of a wireless network within the environment and the signaling capabilities of the EPs and APs may change over time. When these changes reduce the Signal to Noise Ratio (SNR), drop a connection between an EP and an AP, or induce additional latency or packet loss, the applications may receive data at a rate below an operational threshold, and experience aberrant operations as a result. EPs may be any computing device, such as cell phones, laptops, and controllers for Autonomous Vehicles.

The present disclosure provides a cross-layer tool chain for wireless network design, analysis, and optimization that enables users to visualize the effects of changes in the dynamic environment and to compensate for those changes to maintain a level of service for the EPs and applications in the environment. A physical model of the environment is simulated to include a radiographic model of the signaling characteristics of the APs and EPs at various positions in the environment and the effect of various other objects on those signaling characteristics. One or more signaling emulators are run in conjunction with the physical model to probabilistically simulate transmissions between APs and EPs. The signaling emulators adjust the probabilities of various transmission events (e.g., packet loss, interference, delay) based on the radiographic effects of the positions of the APs, EPs, and other objects in the modeled environment. The cross-layer tool chain may provide visualizations or alerts based on the network characteristics (e.g., dropped packet percentage, latency, SNR) over various time periods and subsets or regions of the dynamic environment. In some aspects, the cross-layer tool chain outputs a visual representation of the emulated signal characteristics for the environment in a Graphical User Interface (GUI). In some aspects, the cross-layer tool chain outputs operational commands (e.g., navigational commands, system settings, application instructions) to the EPs in the environment based on real-time changes in the physical environment.

The present disclosure provides for improvements in the functionality and flexibility of various networked devices. By simulating the effects of moving objects within the environment on the signaling characteristics of a wireless network, the positions of APs may be optimized, and the operations of applications running on EPs may be adjusted to account for transient effects imparted by mobile objects, thus allowing for an improved user experience, greater and more reliable wireless network coverage of the environment, and among other benefits.

Figure 1B:
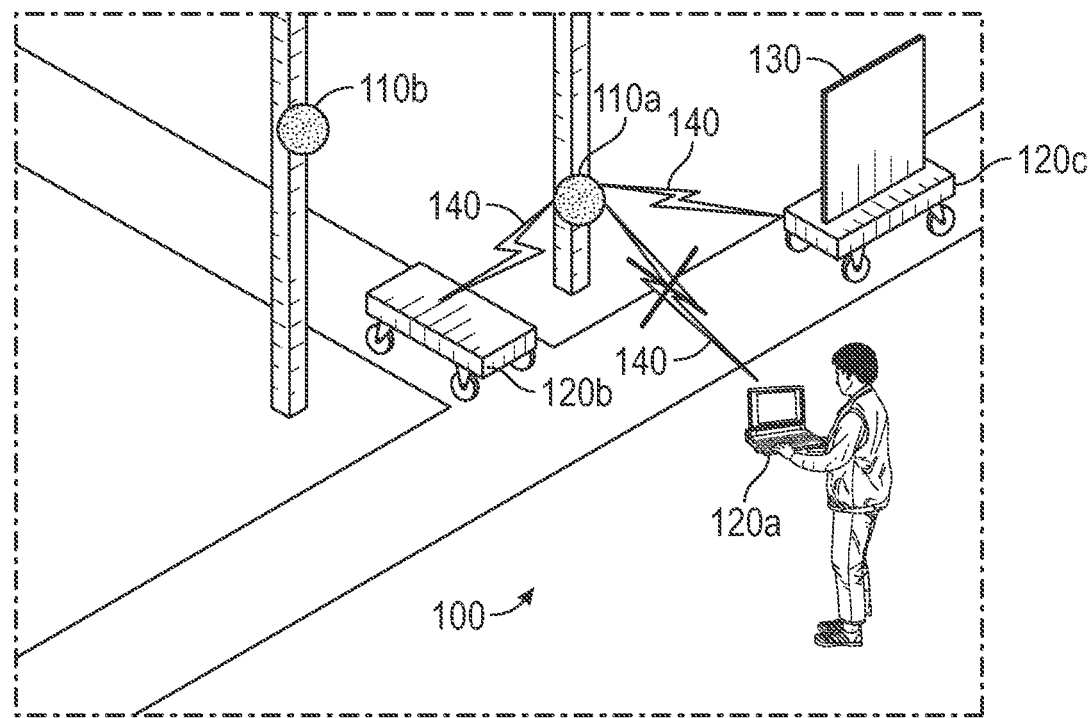
Figure 1C:
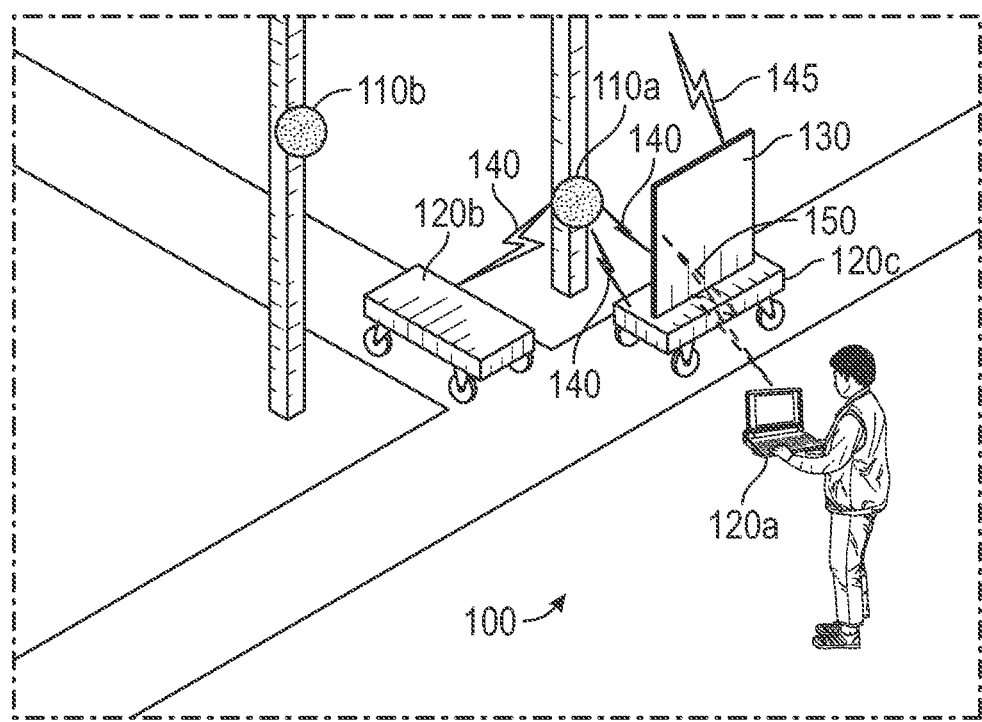
Figure 1D:
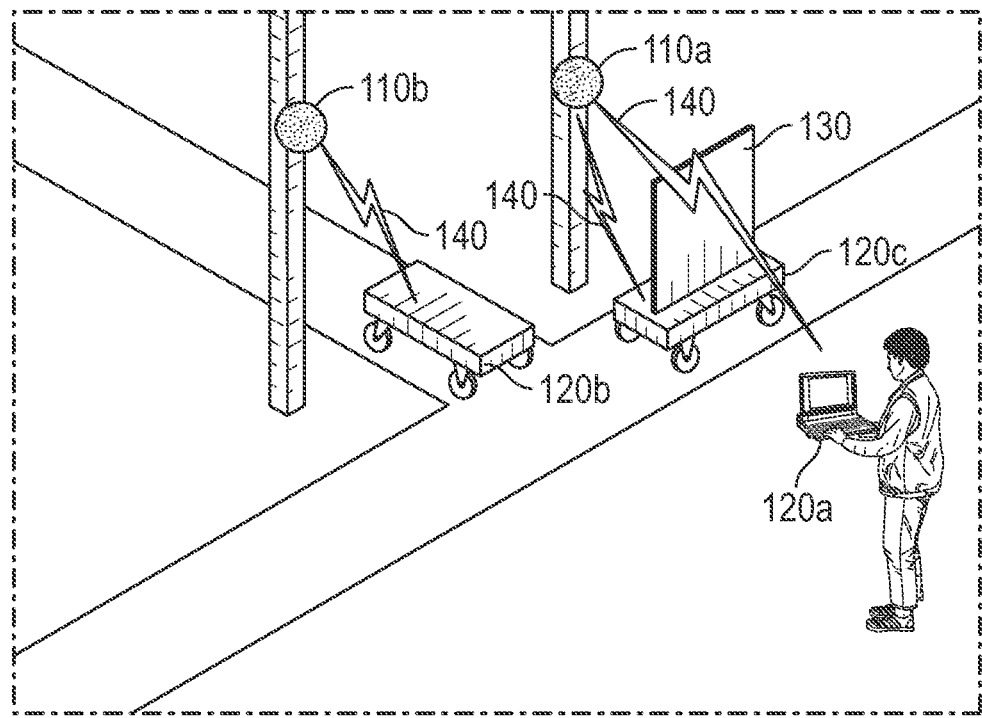

FIGS. 1A-1D illustrate various views of a dynamic environment 100. FIG. 1A illustrates a view of an initial state for the environment 100, and FIGS. 1B-1D illustrate views of later states for the environment in which the locations or orientations of various elements have changed. Each view of the dynamic environment 100 includes a first Access Point 110a (generally, AP or access point 110), a second access point 110b, a first endpoint 120a (generally, endpoint 120), a second endpoint 120b, a third endpoint 120c, and a passive object 130. Several non-limiting examples of signal pathways 140 are illustrated in the views to represent communications between an AP 110 and an EP 120 as may be affected by the environment 100, although, for purposes of clarity in the present disclosure, not all signal pathways 140 or communications generated between APs 110 and EPs 120 are shown.

Each of the views in FIGS. 1A-1D may be a real-world view of the physical dynamic environment 100 or a simulated view of a three-dimensional model of the dynamic environment 100. A cross-layer tool simulates the environment and potential actions taken in the environment so that the APs 110 and EPs 120 in the environment may account for transient differences in signaling characteristics. The cross-layer tool may receive inputs from the dynamic environment 100 in real-time to simulate predicted effects of the movements in the physical environment on the signaling characteristics of the wireless network in the dynamic environment including the effects on different devices and applications at various layers according to the Open Systems Interconnection (OSI) model. The OSI model includes seven layers (Physical, Data Link, Network, Transport, Session, Presentation Application), which describe various functions and data handling properties for networked devices.

FIG. 1A illustrates a dynamic environment 100 in which a first AP 110a has established a connection to a first EP 120a and a third EP 120c along respective signal pathways 140, and a second AP 110b has established a connection to a second EP 120b along a respective signal pathway 140. APs 110 include various computing devices that provide wireless communications within an area. In some aspects, the APs 110 include a network interface to a wireline network, and transition communications between wireless and wireline communications pathways. The APs 110 manage wireless communications according to various different wireless communications standards as specified by administrators for the wireless network in the dynamic environment 100 including WiFi, Bluetooth, cellular communication standards, or a proprietary standard.

The EPs 120 include various computing devices that are in wireless communication with the APs 110, and may include laptops, desktops, smart phones, tablets, automated test equipment, automated manufacturing equipment, autonomous vehicles, etc. As illustrated in FIGS. 1A-D, the first EP 120a is a laptop, the second EP 120b is an unladen autonomous vehicle, and the third EP 120c is an autonomous vehicle loaded with a passive object 130 of a metal plate. Example hardware elements as may be used in APs 110 and EPs 120 are discussed in greater detail in regard to FIG. 2.

FIG. 1B illustrates a second view of the dynamic environment 100 in which the second EP 120b has moved from the location shown in first view shown in FIG. 1A, and attempts to handover communications from the second AP 110b to the first AP 110a. An EP 120 may attempt to handover communication from one AP 110 to a target AP 110 in response to a proximity to the target AP 110, a lower latency to the target AP 110, a higher signal to noise ratio (SNR) with the target AP 110, etc. An AP 110, however, may have a limited number of access nodes, and may drop (or seek to handover) existing communication sessions. For example, when establishing a communications session with the second EP 120b, the first AP 110a may drop a communications session with the first EP 120a. In other aspects, the signals generated by the second EP 120b when approaching the first AP 110a may generate interference on the signal pathway 140 between the first EP 120a and the first AP 110a, which may cause the first AP 110a or the first EP 120a to drop the connection. Wirelessly networked devices may drop a connection, depending on the standard of communication, based on a SNR falling below a threshold, a number of dropped packets within a predefined window, a latency falling below a threshold, establishing a replacement connection, etc.

In FIG. 1B, the second EP 120b is one example of an active interference source that affects the existing connections between the first AP 110a and first EP 120a and the third EP 120c. An active interference source produces radio waves in various wavelengths that coincide with the wavelengths used to communicate wirelessly in the dynamic environment. The active interfaces sources may generate signals that are intended to be communications over the network or signals that are the byproduct of other processes that are not intended communications over the network (e.g., leaked 'signals' from a magnetron). The interference may result in dropped connections, dropped packets, greater reliance on error correction techniques, etc., which affect the signaling characteristics of the network at different network layers.

By knowing when and where potential active sources of interference are expected to be located, a network administrator may make temporary or permanent adjustments to the network architecture accordingly. For example, in relation to FIGS. 1A and 1B, a network controller can send an operational command to the application running on the second EP 120b to maintain a connection with the second AP 110b or to pause or alter navigation of the second EP 120b to allow the first EP 120a and third EP 120c to maintain connections to the first AP 110. In another example, in relation to FIGS. 1A and 1B, a network controller can anticipate the handover of the connection for the second EP 120b from the second AP 110b to the first AP 110a, and attempt to handover the first EP 120a or the third EP 120c to a different AP 110 to avoid dropped connections. In another example, an administrator who is presented with a view of the dynamic environment 100 that indicates potential connection interference may install more APs 110 in the region, upgrade existing APs 110 in the region, or move APs 110 in the region to alter the signaling characteristics in the region to mitigate the interference and improve network connectivity.

FIG. 1C illustrates a third view of the dynamic environment 100 in which the third EP 120c has moved from the location shown in second view shown in FIG. 1B. The passive object 130 carried by the third EP 120c occupies a space in the environment 100 that disrupts the signal pathway 140 between the first AP 110a and the first EP 120a. Depending on the material composition of the passive object 130, the signal pathway 140 may be disrupted in at least one of several ways, such as, for example, blocking the signal pathway 140, producing one or more reflections of the signals carried on reflected signal pathways 145, and resulting in a diminished signal pathway 150. The passive object 130 is one example of a passive source of interference that blocks or attenuates intended communications between networked devices, reflects signals generated by actively communicating devices, or redirects interference from active interference sources.

By knowing when and where potential passive sources of interference are expected to be located, a network administrator may make temporary or permanent adjustments to the network architecture accordingly. For example, in relation to FIGS. 1A and 1C, a network controller can send an operational command to: the application running on the third EP 120c to pause or alter navigation to mitigate the creation of reflected signal pathways 145 or diminished signal pathways 150; to the first AP 110a or first EP 120a to change a gain of an antenna to strengthen a signal carried over a diminished signal pathway 150 or reduce the strength of a signal carried over a reflected signal pathway 145; to the first EP 120a to connect to a different AP 110 to avoid generating reflected signal pathways 145 or diminished signal pathways 150; or any networked device to alter channels of communication to avoid receiving interference from signals carried on reflected signal pathways 145 or overwhelming signals carried on diminished signal pathways 150.

FIG. 1D illustrates a fourth view of the dynamic environment 100 in which the first AP 120a has moved from the location shown in third view shown in FIG. 1C. By tracking the locations APs 110 as well as the locations of EPs 120 (and other potential active interference sources) and passive objects 130, an administrator can see the effects on the signaling characteristics of the network. In FIG. 1D, compared to FIG. 1C, the new position of the first AP 110a avoids the creation of the reflected signal pathway 145 and the diminished signal pathway 150 for communications between the first AP 110a and the first EP 120a due to the different lines of sight for the first AP 110a to the EPs 120 from the new location.

Figure 2:
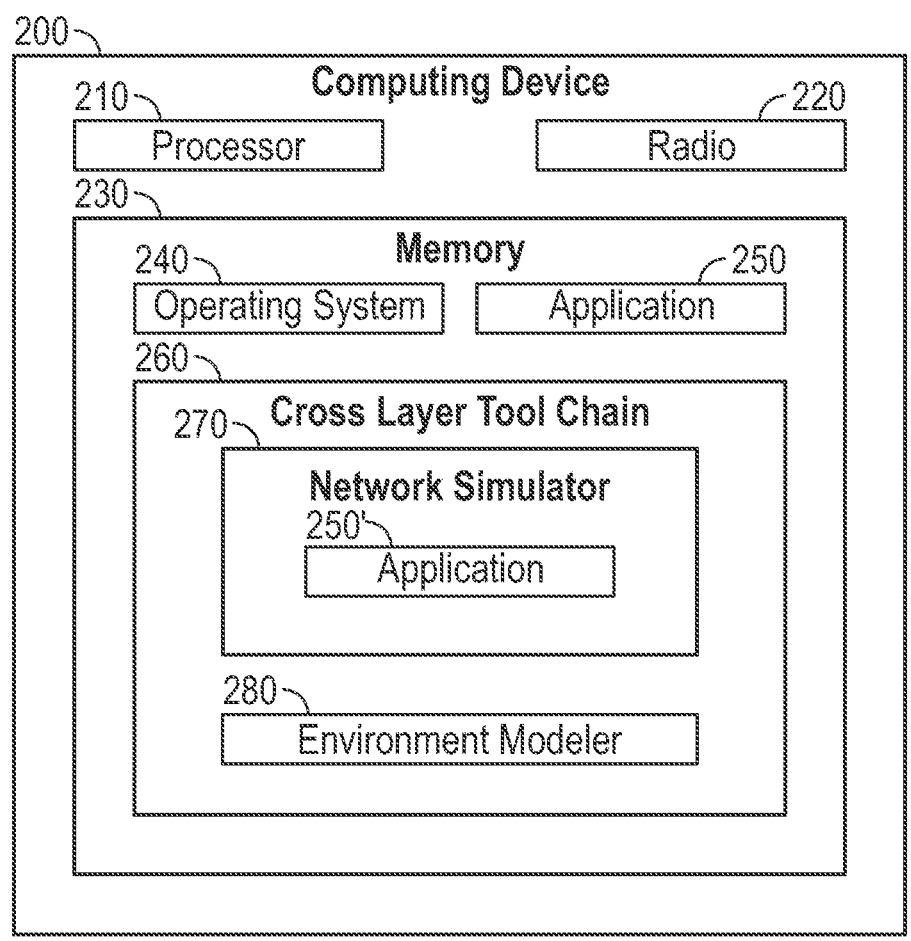
FIG. 2 illustrates an example computing device, according to aspects of the present disclosure.

FIG. 2 illustrates an example computing device 200, such as may be used as an AP 110 an EP 120, a network controller device in communication with the APs 110 and EPs 120, or another computer in wireline or wireless communication with one or more APs 110 or EPs 120. The computing device 200 includes a processor 210, radio 220 or other network interface, a memory 230, and various hardware to provide an output to a user and accept inputs from a user and the environment.

The processor 210 and the memory 230 provide computing functionality to the computing device 200. The memory 230 may be one or more memory devices, such as, for example, Random Access Memory (RAM), Read Only Memory (ROM), flash memory, or any other type of volatile or non-volatile storage medium that includes instructions that the processor 210 may execute. The processor 210 may be any computer processor capable of performing the functions described herein.

The radio 220 provides wireless communications for the computing device 200. In various aspects, the radio 220 is provided in conjunction with a wireline network interface, such as an electrical or optical network transmitter/receiver, which receives signals from external sources and transmits signals to external devices via wired transmission media. The radio 220 may be in communication with various antennas and may configure messages to be transmitted or received according to various standards, such as, Bluetooth, Wi-Fi, or a proprietary standard.

The memory 230 includes program code (also referred to as processor-executable instructions) for an operating system 240, one or more applications 250 (generally, applications 250), and a cross layer tool chain 260, although other applications and data structures may also be included by the memory 230. The cross layer tool chain 260 includes a network simulator 270 that runs an instance 250' of the applications 250 and an environment modeler 280. The program code is generally described as various functional "applications" or "modules" within the memory 230, although alternate implementations may have different functions or combinations of functions. The memory 230 also generally includes data structures that may store information for use by the various program code modules also stored thereon.

The environment modeler 280 produces a three-dimensional model of the dynamic physical environment including the APs 110, EPs 120, and the passive objects 130 in the environment. The three-dimensional model includes models of the individual devices and objects in the dynamic environment 100 that are positionable in the three-dimensional model. The environment modeler 280 models signal sources (including the APs 110, EPS 120, and unintended signal sources) and the signal pathways 140 within the environment. As the model objects are moved in the three-dimensional model of the environment, the environment modeler 280 maps the signal pathways between the APs 110 and EPs 120. These signal pathways 140 include the pathways that are used for communicating between the APs 110 and EPs 120 as well as unused pathways resulting from broadcast transmissions, reflections, and active non-signaling interference sources modeled in the environment. In some aspects, a user simulates various scenarios in the model, specifying positions for various objects to move through the environment and the setup of various communications that the APs 110 and EPs 120 engage in. In some aspects, a user sets the environment modeler 280 to use the reported positions of the objects in the physical environment and the applications 250 active thereon (reported in real-time) to simulate the environment in the three-dimensional model.

The network simulator 270 emulates the traffic generated and transmitted over the wireless network by the various applications 250 running on the networked devices (e.g., the APs 110 and EPs 120) within the environment being simulated. In some aspects, the network simulator 270 uses historic usage data to model simulated inputs to the various applications 250. In some aspects, the network simulator 270 uses reported usage data from the EPs 120 to emulate the traffic generated for transmission over the wireless network. The network simulator 270, when emulating traffic, uses the physical properties of the modeled physical objects and the strengths of signals carried over the modeled signal pathways 140 to determine whether data are received at the intended destinations and the effects that missing data have on the applications 250. The signal properties simulated by the network simulator 270 include multi-pathing (including multiple line-of-sight and reflections to link two communicating devices) and the strength of the signals within the environment.

To emulate the traffic, the network simulator 270 probabilistically determines when a packet or datagram sent along a signal pathway 140 is dropped or corrupted. The network simulator 270 increases the probability of loss or corruption when a radio opaque object is present in the signal pathway 140 (e.g., reducing or fully attenuating signal strength) or additional signals occupy the signal pathway 140 (e.g., cross-talk interference) in the simulated model.

Using the emulated traffic remaining after the probabilistic dropping (as received at an AP 110 or EP 120), the network simulator 270 simulates the responses of the applications 250' emulated as running thereon. In response to receiving less than the full amount of traffic, the emulated applications 250' slow down, reduce quality, prioritize certain downloads/processes, and lose connections/shutdown depending on the transmission standard and application 250. The network simulator 270 determines a level of service that the application 250 provides to the EP 120 (and an associated user) in light of the reduced traffic. In one example, an application 250 providing video playback provides a lower resolution or framerate when a lower rate of data is received. In another example, an application 250 providing access to a document stored on a networked storage location may be less responsive or take longer to save or retrieve content when a lower rate of data is received In other aspects, the network simulator 270 monitors and adjusts the connections established between APs 110 and EPs 120 in response to the changes in traffic received by the networked devices and the locations of the devices. In one example, if an application 250 drops X packets in succession (i.e., drops a first, second, third, . . . Xth packet without an intervening receiving packet) a connection is assumed to be lost, and a new connection is attempted to be established. In another example, an AP 110 may maintain up to X unique connections at a time, and will drop an existing connection when a new connection is requested. In response, the network simulator 270 emulates dropped connections and handover procedures to redistribute connections, and handshake procedures to establish new connections, including downtime in the application 250 that are awaiting a connection to be established.

Depending on the level of service available from the application 250 in light or the reduced traffic, and whether the network simulator 270 determines that a new connection is needed (e.g., due to connection number limits, SNR or performance thresholds), the cross layer tool chain 260 may output various commands to APs 110 or EPs 120 in the physical environment. In various examples, the cross layer tool chain 260 outputs a command to an AP 110 to maintain a connection, increase an antenna gain, decrease an antenna gain, reserve a channel, handover an EP 120 to a different AP 110, move an antenna, etc. In various examples, the cross layer tool chain 260 outputs a command to an EP 120 to reduce a quality of service, to limit (and thereby prioritize) various data requests, to increase an antenna gain, to decrease an antenna gain, to provide a notification or navigation command to move the EP 120 to a different location or to avoid entering a region with signaling characteristics below a threshold, etc.

The cross layer tool chain 260 is also able to output a two or three dimensional view of the simulated environment with one or more of the networking characteristics overlaid as a mask. The overlaid mask shows a user a visual representation of where in the dynamic environment 100 the signal pathways 140 may provide reliable or unreliable service for various applications 250 so that the user may adjust the locations of APs 110, EPs 120, or passive objects 130 relative to one another, plot routes to move various EPs 120 or passive objects 130 throughout the dynamic environment 100, or time the operation of various APs 110 and EPs 120 to avoid or mitigate interference.

Figure 3:
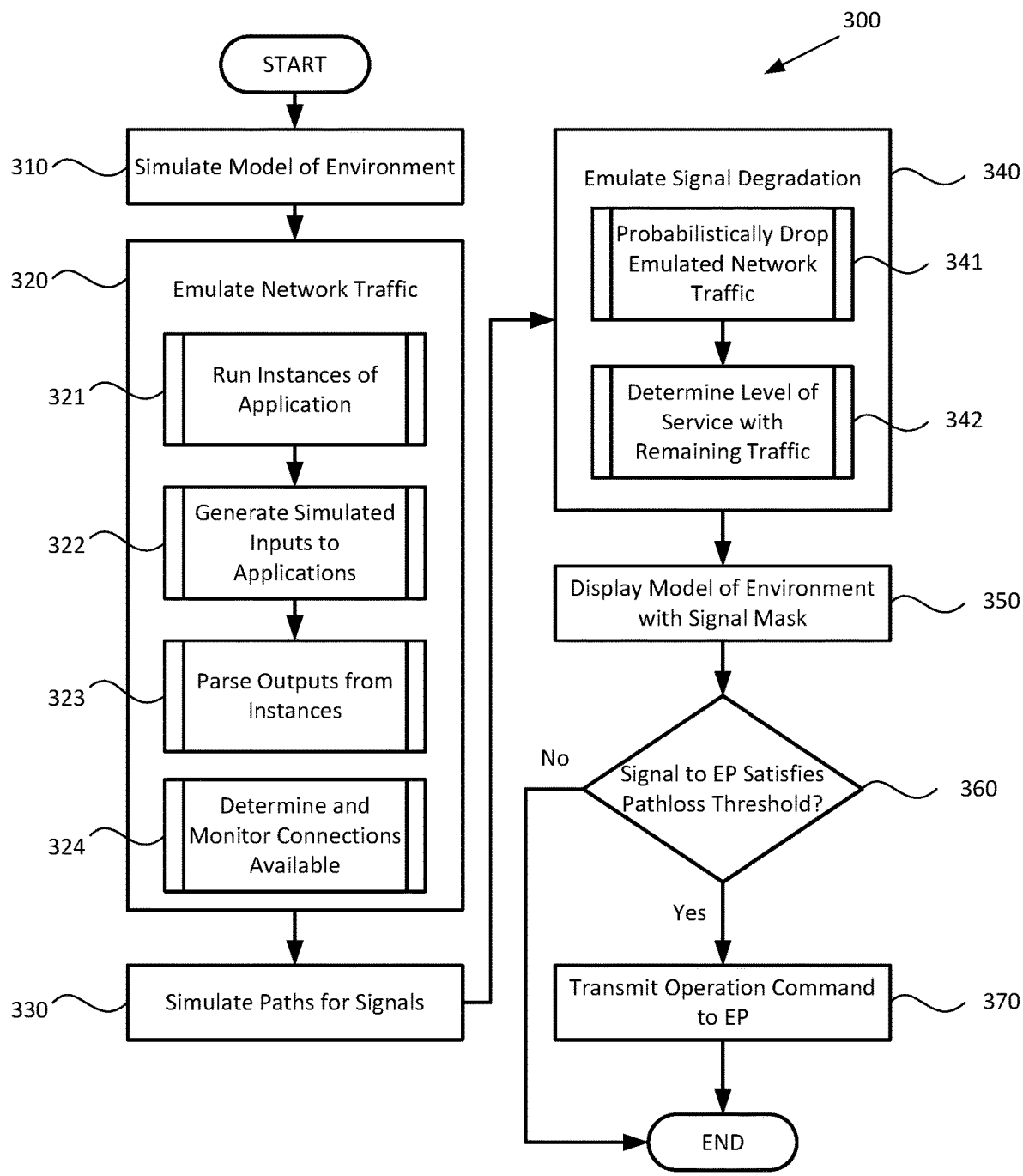
FIG. 3 is a flowchart of a method for providing a cross-layer tool chain for wireless network design, analysis, and optimization and for dynamic pathloss mitigation, according to aspects of the present disclosure.

FIG. 3 is a flowchart of a method 300 for providing a cross-layer tool chain 260 for wireless network design, analysis, and optimization and for dynamic pathloss mitigation. Method 300 begins at block 310, where an environment modeler 280 simulates a model of the physical environment including the various objects within the environment (e.g., APs 110, EPs 120, passive objects 130, other signal sources).

At block 320, a network simulator 270 emulates network traffic between the various APs 110 and EPs 120 modeled in the environment. The network simulator 270 runs 321 instances 250' of the applications 250 running on the APs 110 and EPs 120 to generate 322 the data that are simulated as being transmitted wirelessly as inputs between the APs 110 and EPs 120. The network simulator 270 parses 323 the outputs from the instances 250' of the applications 250 based on the inputs to determine further network traffic generated for transmission between the APs and EPs 120. As part of emulating network traffic between the various APs 110 and EPs 120 modeled in the environment, the network simulator 270 determines and monitors 324 the connections established and available on the various APs 110 and EPs 120.

At block 330, the network simulator 270 determines and simulates the signal pathways 140 that the transmitted data follow in the modeled environment. The signal pathways 140 include reflected signal pathways 145 and diminished signal pathways 150 that take into account the various objects and other signals being transmitted in the modeled environment.

At block 340, the network simulator 270 emulates signal degradation on the simulated pathways 140, probabilistically dropping 341 at least a portion of the traffic based on the obstacles in the pathway that the traffic is carried on, and determining and monitoring 342 the level of service provided to the instances 250' of the applications 250 based on the remaining traffic.

At block 350, the cross layer tool chain 260 outputs for display the three-dimensional model of the environment with one or more signal masks that illustrate the signaling characteristics of the environment in association with the physical objects simulated in the environment. The output view of the three-dimensional model may include still images of the environment with various arrangements of objects therein, or may include animations of the environment with various objects moving to different arrangements to show a user the effect of one or more objects on the signaling characteristics of the network across one or more networking layers. Method 300 may then conclude In addition to or instead of proceeding to block 350, at block 360, the cross layer tool chain 260 determines whether a given EP 120 simulated in the environment is affected by signal degradation severe enough to satisfy a pathloss threshold. The cross layer tool chain 260 may set the pathloss threshold to measure various aspects of network health and reliability including the maximum, minimum, or average of an SNR, an expected latency between devices, expected packet loss percentage between devices, dropped connection rate, etc. In response to the signal degradation for the given EP 120 not satisfying the pathloss threshold, method 300 may conclude.

In response to the signal degradation for the given EP 120 satisfying the pathloss threshold, method 300 proceeds to block 370. At block 370, the cross layer tool chain 260 transmits a command to one or more application 250 running on the EP 120 to affect the operation of the EP 120. In one example, the cross layer tool chain 260 transmits a navigational command to an EP 120 navigating the physical environment 100 (e.g., an autonomous vehicle, a wayfinder device for a person) that specifies a route to follow or a region to avoid when moving the EP 120 from one location to another location to thereby avoid regions that satisfy the pathloss threshold. In another example, the cross layer tool chain 260 transmits an application instruction that specifies a level of service that the application 250 provides to the EP 120 based on available signals to the EP 120 (e.g., adjusting a playback quality). In another example, a system setting, such as an antenna gain, antenna orientation, caching strategy, etc. for the EP 120 to maintain a connection with an AP 110.

Method 300 may then conclude.

Figure 4A:
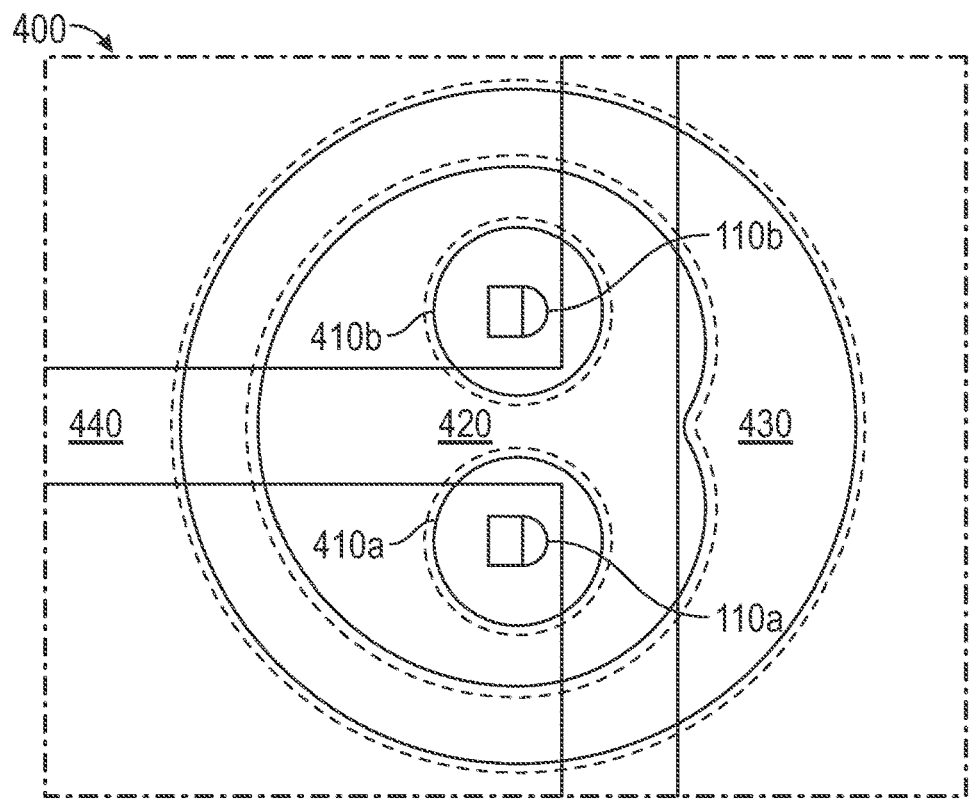
FIGS. 4A and 4B illustrate network strength views, according to aspects of the present disclosure.
Figure 4B:
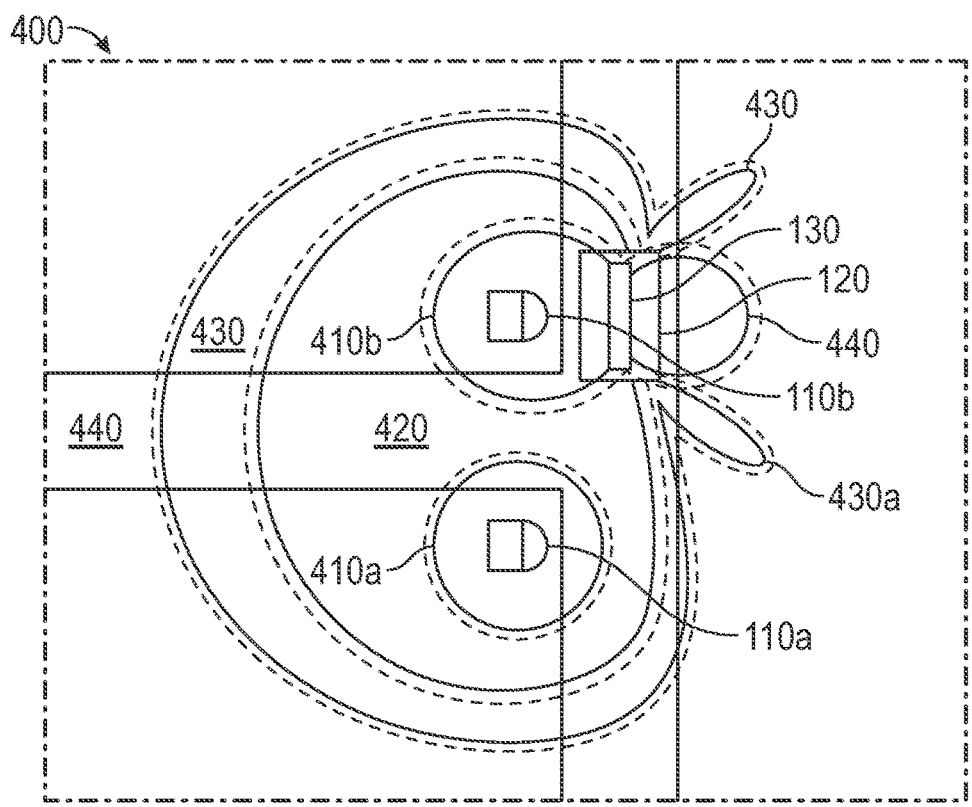

FIGS. 4A and 4B illustrate network strength views in a GUI 400, as may be output by the tool, which may be likened to heatmaps or topographical views of signal quality within the dynamic environment 100. FIGS. 4A and 4B illustrate a top-down view of a dynamic environment 100 in which two APs 110 are shown with surrounding signal quality regions. The signal quality regions illustrate various measures of the network signaling characteristics such a SNR, packet reception rate, latency, a dropped connection rate, etc., that a user may select from. In various aspects, the user selects one or more signaling characteristics, a presentation style (e.g., topographical or heatmap), and a mode of analysis (e.g., highest, average, or lowest value) when presented a signal strength view.

FIG. 4A illustrates a first network strength view, in which the first AP 110a and the second AP 110b are surrounded by a respective first regions 410a, 410b (generally, first regions 410). Each of the first regions 410 define a three-dimensional region of space in the dynamic environment 100 that has signaling characteristics within a first set of characteristics (e.g., SNR between A and B). A second region surrounds the first regions 410, which defines a three-dimensional region of space in the dynamic environment 100 that has signaling characteristics within a second set of characteristics (e.g., SNR between B and C). Similarly, a third region 430, and a fourth region 440 having respective third and fourth sets of characteristics measured may be presented. Depending on system settings, a user may specify more or fewer than four distinct regions in a topographical view, or may specify a gradient view via a heatmap (based on colors and intensities thereof representing various values and signaling characteristics) of the signaling characteristics.

FIG. 4B illustrates a second network strength view, in which an EP 120 and a passive object 130 are introduced into the dynamic environment 100. The altered regions 410, 420, 430, 440 illustrate the effects that the EP 120, as another signal source, and the passive object 130, as a reflector or attenuator of signals generated by the signal sources (the APs 110 and EP 120 in the example illustrated) have on the signaling characteristics from the first network strength view. The various signals transmitted from the signal sources, reflected by, and attenuated by various objects are represented in the signaling characteristics modeled by the tool.

The tool may present the various views of the signaling characteristics as individual views of the environment or as an animation as a signal degradation mask over a view of the representations of physical objects in the dynamic environment 100. The signal degradation mask when overlaid over the model of the environment shows the signaling characteristics in various colors with hues, transparencies, intensities, or contrasts corresponding to various values. In one example, a signal degradation mask shows areas of the dynamic environment 100 with direct line-of-sight to an AP 110 in a first color (e.g., green), and areas without direct line-of-sight in a second color (e.g., red). In another example, a signal degradation mask shows areas below a first SNR in a first intensity of a first color (e.g., light blue), areas with an SNR between the first SNR and a second SNR with a second intensity of the first color (e.g., blue), and areas with an SNR above the second SNR with a third intensity of the first color (e.g., dark blue). A graphical user interface (GUI) providing the view of the environment and the signal degradation masks allows a user to select which masks are shown, a viewpoint in the environment, color effects to associated with various signal metrics, and time ranges or scenarios to illustrate in the simulated views.

Additionally, when an EP 120 is located inside or outside a specific region or regions, the tool may issue an alert to an administrative user or automatically generate an operational command for one or more applications 250 running on the EPs 120. The operational commands may be generated in real-time, as EPs 120 and passive objects 130 move about the dynamic environment 100, or in non-real-time in anticipation of an EP 120 or passive object 130 moving into a simulated arrangement (e.g., to avoid a situation where an EP 120 loses communications with an AP 110). Examples of operational commands include: a navigational command to the EP 120 navigating the physical environment 100, that specifies a route to follow or region(s) to avoid when moving the EP 120 from one location to another to avoid regions that satisfy a pathloss threshold; an application instruction, specifying a level of service that the application 250 provides to the EP 120 based on available signal strength to the EP 120 (e.g., pre-caching content, reducing framerate); and a system setting, specifying a new position to move the EP 120 to so that a connection with an AP 110 can be maintained.

In the current disclosure, reference is made to various aspects. However, it should be understood that the present disclosure is not limited to specific described aspects. Instead, any combination of the following features and elements, whether related to different aspects or not, is contemplated to implement and practice the teachings provided herein. Additionally, when elements of the aspects are described in the form of "at least one of A and B," it will be understood that aspects including element A exclusively, including element B exclusively, and including element A and B are each contemplated. Furthermore, although some aspects may achieve advantages over other possible solutions and/or over the prior art, whether or not a particular advantage is achieved by a given aspect is not limiting of the present disclosure. Thus, the aspects, features, aspects and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, aspects described herein may be embodied as a system, method or computer program product. Accordingly, aspects may take the form of an entirely hardware aspect, an entirely software aspect (including firmware, resident software, micro-code, etc.) or an aspect combining software and hardware aspects that may all generally be referred to herein as a "circuit," "module" or "system." Furthermore, aspects described herein may take the form of a computer program product embodied in one or more computer readable medium(s) having computer readable program code embodied thereon.

Program code embodied on a computer readable medium may be transmitted using any appropriate medium, including but not limited to wireless, wireline, optical fiber cable, radio frequency (RF), etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatuses (systems), and computer program products according to aspects of the present disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block(s) of the flowchart illustrations and/or block diagrams.

These computer program instructions may also be stored in a computer readable medium that can direct a computer, other programmable data processing apparatus, or other device to function in a particular manner, such that the instructions stored in the computer readable medium produce an article of manufacture including instructions which implement the function/act specified in the block(s) of the flowchart illustrations and/or block diagrams.

The computer program instructions may also be loaded onto a computer, other programmable data processing apparatus, or other device to cause a series of operational steps to be performed on the computer, other programmable apparatus or other device to produce a computer implemented process such that the instructions which execute on the computer, other programmable data processing apparatus, or other device provide processes for implementing the functions/acts specified in the block(s) of the flowchart illustrations and/or block diagrams.

The flowchart illustrations and block diagrams in the Figures illustrate the architecture, functionality, and operation of possible implementations of systems, methods, and computer program products according to various aspects of the present disclosure. In this regard, each block in the flowchart illustrations or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order or out of order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

While the foregoing is directed to aspects of the present disclosure, other and further aspects of the disclosure may be devised without departing from the basic scope thereof, and the scope thereof is determined by the claims that follow.

What is claimed is:

1. A method, comprising:
   simulating a three-dimensional model of a physical environment including:
   an access point located at a first location,
   an endpoint located at a second location and that is running an application,
   a plurality of signal pathways for signals to travel between the access point and the endpoint in the three-dimensional model, wherein the signal pathways comprise at least a communication pathway, a reflected signal pathway and a diminished signal pathway, and
   a passive object that moves from a third location in the three-dimensional model, where the passive object does not cause signal degradation of signals traveling over the plurality of signal pathways, to a fourth location in the three-dimensional model where the passive object causes signal degradation of signals over the communication pathway of the plurality of signal pathways, wherein the signal degradation comprises a signal interference caused by signals in one or more of the reflected signal pathway and the diminished signal pathway;
   emulating, in the model, network traffic for the application transmitted as a plurality of emulated signals that are emulated as being transmitted between the access point and the endpoint along the plurality of signal pathways;
   emulating, in the model, a level of signal degradation along the plurality of signal pathways for the plurality of emulated signals as the passive object moves from the third location and to the fourth location; and
   in response to the level of signal degradation for the plurality of emulated signals satisfying a pathloss threshold, outputting a command to the application to affect operations of the endpoint, wherein the command reduces the signal degradation of signals over the communication pathway by mitigating the signal interference caused by signals in one or more of the reflected signal pathway and the diminished signal pathway.

2. The method of claim 1, wherein the endpoint moves from the second location to a fifth location and the command includes one of:
- a navigational command to the endpoint navigating the physical environment, wherein the navigational command specifies a route to follow when moving the endpoint, wherein the route avoids a given region that satisfies the pathloss threshold;
- an application instruction, specifying a level of service that the application provides to the endpoint based on available signals to the endpoint at the second location; and
- a system setting, specifying a sixth location to move the endpoint to maintain a connection with the access point.

3. The method of claim 1, wherein emulating the level of signal degradation further comprises:
- probabilistically dropping at least a portion of the network traffic based on disruptions over the plurality of signal pathways, wherein individually emulated packets are dropped from the network traffic based on a probability of loss or corruption over a signal pathway of the plurality of signal pathways when the passive object is located in the signal pathway; and
- determining a level of service that the application provides to the endpoint based on a remaining portion of the network traffic.

4. The method of claim 1, wherein a second access point is simulated in the model and emulating the level of signal degradation further comprises:
- probabilistically dropping at least a portion of the network traffic based on disruptions of the plurality of signal pathways, wherein individually emulated packets are dropped from the network traffic based on a probability of loss or corruption over the plurality of signal pathways; and
- in response to determining that the endpoint is attempting to disconnect from the access point and connect to the second access point based on the portion of the network traffic being dropped, determining whether the second access point has available connection slots.

5. The method of claim 1, wherein simulating the three-dimensional model of the physical environment further includes simulating an active interference source that affects the level of signal degradation.

6. The method of claim 1, wherein emulating the network traffic for the application transmitted between the access point and the endpoint further comprises:
- running an instance of the application in the model;
- generating simulated inputs to the application based on historic operational inputs; and
- parsing outputs based on the simulated inputs to identify the network traffic generated by the instance of the application.

7. The method of claim 1, further comprising:
- displaying, in a Graphical User Interface, the three-dimensional model with a signal degradation mask.

8. The method of claim 7, wherein the signal degradation mask is a heatmap illustrating at least one of:
- an average expected latency between the access point and the endpoint across the physical environment;
- an average expected packet loss percentage between the access point and the endpoint at various locations across the physical environment;
- an average expected signal to noise ratio across the physical environment; and
- an average dropped connection rate between the access point and the endpoint across the physical environment in a time window.

9. The method of claim 7, wherein the signal degradation mask is a heatmap illustrating at least one of:
- a worst-case expected latency between the access point and the endpoint across the physical environment;
- a worst-case expected packet loss percentage between the access point and the endpoint across the physical environment;
- a worst-case expected signal to noise ratio across the physical environment; and
- a worst-case dropped connection rate between the access point and the endpoint across the physical environment in a time window.

10. The method of claim 7, wherein the signal degradation mask indicates a fifth location to reposition the access point at to thereby reduce, compared to the first location, at least one of:
- a latency between the access point and the endpoint;
- a packet loss percentage between the access point and the endpoint;
- a signal to noise ratio within a first range from the access point;
- a signal to noise ratio within a second range from the endpoint; and
- a dropped connection rate between the access point and the endpoint in a time window.

11. The method of claim 1, wherein:
- the third location and the fourth location are different locations in the three-dimensional model of the physical environment; and
- the network traffic is emulated over a time period, wherein:
  - the network traffic is emulated and included in the plurality of emulated signals at a first time when the passive object is at the third location; and
- the network traffic is emulated and included in the plurality of emulated signals at a second time when the passive object is at the fourth location.

12. A system, comprising:
- a processor; and
- a memory, including instructions that, when performed by the processor, enable the processor to perform an operation, the operation comprising:
  - simulating a three-dimensional model of a physical environment including:
    - an access point located at a first location,
    - an endpoint located at a second location and that is running an application,
    - a plurality of signal pathways for signals to travel between the access point and the endpoint in the three-dimensional model, wherein the signal pathways comprise at least a communication pathway, a reflected signal pathway, and a diminished signal pathway, and
    - a passive object that moves from a third location in the three-dimensional model, where the passive object does not cause signal degradation of signals traveling over the plurality of signal pathways, to a fourth location in the three-dimensional model where the passive object causes signal degradation of signals over the communication pathway of the plurality of signal pathways, wherein the signal degradation comprises a signal interference caused by signals in one or more of the reflected signal pathway and the diminished signal pathway;

emulating, in the model, network traffic for the application transmitted as a plurality of emulated signals that are emulated as being transmitted between the access point and the endpoint along the plurality of signal pathways;

emulating, in the model, a level of signal degradation along the plurality of signal pathways for the plurality of emulated signals as the passive object moves from the third location and to the fourth location; and in response to the level of signal degradation for the plurality of emulated signals satisfying a pathloss threshold, outputting a command to the application to affect operations of the endpoint, wherein the command reduces the signal degradation of signals over the communication pathway by mitigating the signal interference caused by signals in one or more of the reflected signal pathway and the diminished signal pathway.

13. The system of claim 12, wherein the endpoint moves from the second location to a fifth location and the command includes one of:
a navigational command to the endpoint navigating the physical environment, wherein the navigational command specifies a route to follow when moving the endpoint from the second location to the fifth location, wherein the route avoids a given region that satisfies the pathloss threshold;
an application instruction, specifying a level of service that the application provides to the endpoint based on available signals to the endpoint at the second location; and
a system setting, specifying a sixth location to move the endpoint to maintain a connection with the access point.

14. The system of claim 12, wherein emulating the level of signal degradation further comprises:
probabilistically dropping at least a portion of the network traffic based on disruptions over the plurality of signal pathways, wherein individually emulated packets are dropped from the network traffic based on a probability of loss or corruption over a signal pathway of the plurality of signal pathways when the passive object is located in the signal pathway; and
determining a level of service that the application provides to the endpoint based on a remaining portion of the network traffic.

15. The system of claim 12, wherein emulating the network traffic for the application transmitted between the access point and the endpoint further comprises:
running an instance of the application in the model;
generating simulated inputs to the application based on historic operational inputs; and
parsing outputs based on the simulated inputs to identify the network traffic generated by the instance of the application.

16. The system of claim 12, the operation further comprising:
displaying, in a Graphical User Interface, the three-dimensional model with a signal degradation mask.

17. The system of claim 16, wherein the signal degradation mask is a topographical map illustrating several regions defined by ranges for signaling characteristics including at least one of:

a latency between the access point and the endpoint;
a packet loss percentage between the access point and the endpoint;
a signal to noise ratio; and
a dropped connection rate between the access point and the endpoint.

18. A system, comprising:
a processor; and
a memory, including instructions that, when performed by the processor, provide a cross layer tool chain including:
an environment modeler, configured to produce a three-dimensional model of a dynamic environment including:
an access point device located at a first location,
an endpoint device located at a second location and that is running an application,
a plurality of signal pathways for emulated signals travelling between the access point device and the endpoint device in the three-dimensional model, wherein the signal pathways comprise at least a communication pathway, a reflected signal pathway, and a diminished signal pathway;
a passive object that moves from a third location in the three-dimensional model, where the passive object does not cause signal degradation of the emulated signals traveling over the plurality of signal pathways, to a fourth location in the three-dimensional model where the passive object causes signal degradation of the emulated signals over the plurality of signal pathways; and
a network simulator, configured to:
run an instance of the application running on the endpoint device;
emulate network traffic generated by the application;
simulate transmission of the emulated signals to carry the network traffic between the access point device and the endpoint device along the communication pathway of the plurality of signal pathways;
degrade the network traffic based on the passive object moving from the third location and to the fourth location through the plurality of signal pathways and causing signal degradation in the emulated signals, wherein the signal degradation comprises a signal interference caused by signals in one or more of the reflected signal pathway and the diminished signal pathway; and
monitor performance of the application based on the network traffic as degraded.

19. The system of claim 18, wherein the environment modeler outputs, in a Graphical User Interface, the three-dimensional model and a signal degradation map overlaid on the three-dimensional model based on the network traffic simulated by the network simulator.

20. The system of claim 18, wherein:
the network simulator outputs, in response to identifying that performance of the application falls below a pathloss threshold, an operational command to the endpoint device; and
the endpoint device moves from a second location in the dynamic environment to a fifth location, and the operational command includes:
a navigational command to the endpoint device navigating the dynamic environment, wherein the navigational command specifies a route to follow when moving the endpoint device, wherein the route avoids a given region that satisfies the pathloss threshold;
an application instruction, specifying a level of service that the application provides to the endpoint device based on available signals to the endpoint device at the second location; and
a system setting, specifying a sixth location to move the endpoint device to that maintains a connection with the access point device.

\* \* \* \* \*